Feb. 15, 1966 D. A. NAYMIK 3,235,428

METHOD OF MAKING INTEGRATED SEMICONDUCTOR DEVICES

Filed April 10, 1963 2 Sheets-Sheet 1

INVENTOR
BY D. A. NAYMIK
H. W. Lockhart
ATTORNEY

United States Patent Office 3,235,428
Patented Feb. 15, 1966

3,235,428

METHOD OF MAKING INTEGRATED SEMICONDUCTOR DEVICES

Daniel A. Naymik, Summit, N.J., assignor to Bell Telephone Laboratories, Incorporated, a corporation of New York Filed Apr. 10, 1963, Ser. No. 271,977
5 Claims. (Cl. 156—89)

This invention relates to semiconductor integrated circuit devices and particularly to the fabrication of a multiple array of semiconductor elements which are electrically insulated one from another and form a single unitary structure.

The semiconductor integrated circuit art currently uses two general approaches for fabricating integrated devices. According to one general method, the substrate for a semiconductor integrated circuit comprises a solid slice of monocrystalline semiconductor material. The various elements of the circuit are fabricated in separated portions of the slice by solid state diffusion using masking and other techniques well known in the art. Electrical isolation between the individual elements, which may comprise transistors, diodes, and other active or passive devices, is provided by zones of particular conductivity type and value. In other words, isolation is provided by interposing one or more PN junctions. Electrical interconnections between the particular electrodes of the individual elements of the circuit are provided advantageously by metal films deposited on the surface of the slice of material. This is conveniently done through masks by well-known methods.

The other general approach to the fabrication of integrated circuit devices is to mount individual semiconductor wafers in close proximity on a common insulating mounting material such as a ceramic plate. Each semiconductor wafer contains at least a circuit element to be included in the integrated circuit, and an individual wafer may contain several active elements in certain configurations. Interconnection between the electrodes of the different elements is provided usually by fine wires thermocompression bonded to the element electrodes.

Devices fabricated in accordance with the first approach have the disadvantage in many applications of unwanted parasitic electrical effects as a result of inadequate isolation between individual elements. Under certain circumstances, reverse leakage current occurs across the isolating junction and they are often a source of unwanted capacitance.

Integrated circuit devices fabricated in accordance with the other general technique afford excellent electrical isolation but require complex thermocompression bonded wire interconnections which are laborious to apply, may be the source of unwaned inductance and are subject to mechanical and electrical failure.

Therefore, an object of this invention is an improved semiconductor integrated circuit device.

In particular, an object of this invention is a semiconductor subtrate for integrated circuit fabrication having a high degree of electrical isolation between separate elements and at the same time permitting circuit interconnections of deposited metal films.

One form of this invention is a method in which a plurality of semiconductor slices are bonded together using an insulating glass or suitable vitreous material as the bonding medium to produce a bonded structure comprising layers of semiconductor material separated by thin layers of insulating glass cement. This layered structure then is cut transversely into a series of slices which then are bonded together again in similar fashion to reform a bonded structure. Finally, the bonded structure is cut a third time along a series of planes mutually perpendicular to both of the preceding cuts with the result that a series of slices are produced, each of which is composed of an array of individual semiconductor wafers bonded together by a thin vitreous insulating film. The number and shape of the wafers in this resulting slice is, of course, a function of the number and thickness of the slices initially bonded together and the number and thickness of slices produced in the first and second cutting operations.

The properties of individual elements in the final slice may be determined by providing slices of semiconductor material for the initial bonding step which have particular properties relating to conductivity, lifetime, and other electrical characteristics. Moreover, it will be advantageous for certain applications to provide one or more layers of a completely different material, such as an insulating glass, so as to provide elements in the final array suitable as substrates for other thin film devices.

A feature of this invention is a unitary array of individual wafers of semiconductor or like material uniformly and intimately bonded together but electrically insulated from each other.

The invention and its other objects and features may be better understood from the following more detailed description taken in connection with the drawing in which:

FIG. 1 represents in schematic form a perspective view of the bonded structure produced in accordance with the first step of the method;

FIG. 2 similarly shows the second bonded structure formed in accordance with the invention;

Figure 3:
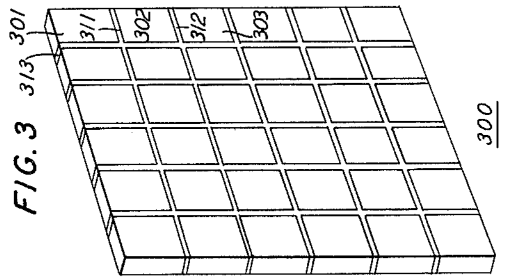
FIG. 3 shows in representative form the slice of individual bonded elements which is the product of the method.

Referring to the drawing, it will be understood that the structures shown are idealized and magnified in certain proportions for ease of explanation. In particular, semiconductor slice material is usually irregular in form as it is cut from various ingot configurations. Thus the first bonded structure of FIG. 1 would comprise a solid of rather irregular exterior unless it were trimmed to the cubical form shown.

In accordance with one preferred embodiment of the invention, a plurality of semiconductor slices 101 through 106 are carefully polished on both faces to ensure a high degree of flatness. In this particular embodiment, the slices are of single crystal silicon and of various resistivities. The thickness of the slices is approximately .010 inch, which is determinative of one dimension of the individual elements in the final slice. After polishing, the faces of the slices are thermally oxidized to facilitate the glass bonding operation. The slices then are stacked as shown with layers of powdered glass in the interstices 111 through 115. One glass found suitable for this bonding is known as Corning 7059 glass. Lead glass may also be employed for this purpose. In lieu of supplying the glass in loose powdered form, it may be applied from thin tape-like sheets. The assembled layered structure is oven heated in an inert atmosphere to a temperature of about 1200 to 1300 degrees centigrade for a period of about sixty minutes, after which it is cooled to room temperature. This process is referred to generally herein, as vitreous bonding.

Figure 1:
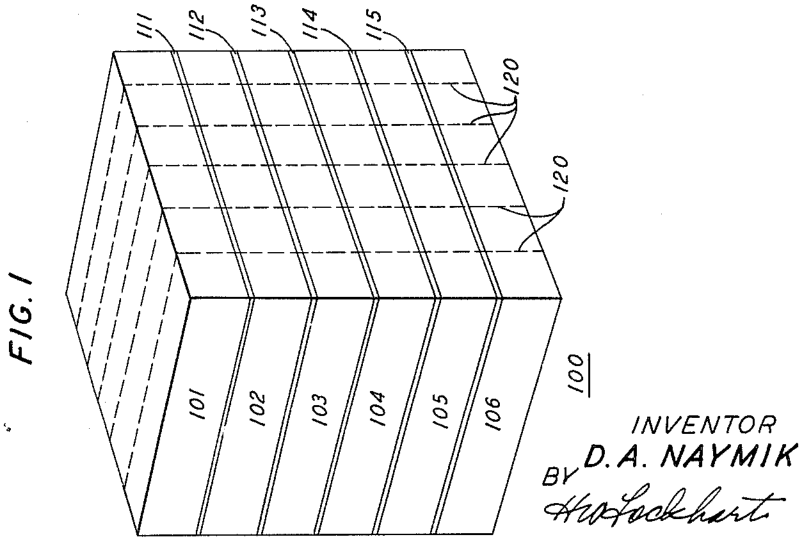

The bonded structure of FIG. 1 next is cut along the planes represented by the series of broken lines 120 to produce slices transverse to the original slices. These slices then are polished and thermally oxidized as set forth in connection with the initial slices 101 through 106.

Figure 2:
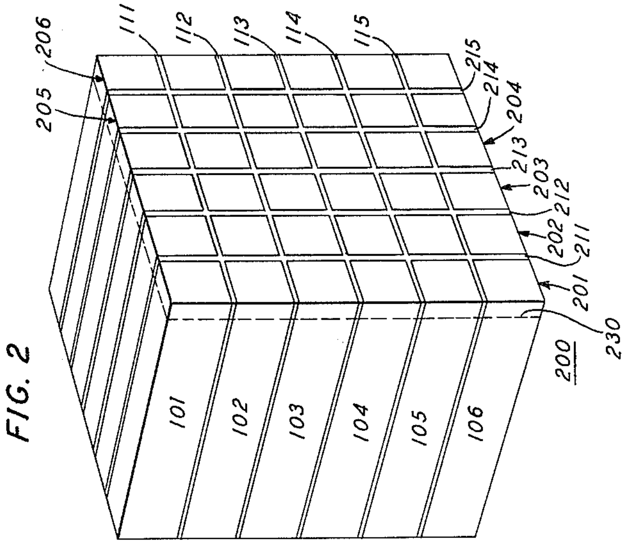

Referring to FIG. 2, the slices 201 through 206 next are bonded together by the vitreous layers 211 through 215 to reform a bonded structure 200. Care must be exercised during this second bonding operation not to affect the bonds made during the first bonding step.

As a final major step in the method, the bonded structure 200 of FIG. 2 is cut along a series of planes parallel to the plane represented by the broken line 230 of FIG. 2 which results in a slice 300 having the configuration shown in FIG. 3. The individual elements 301, 302, 303, et cetera, of the slice 300 are insulated from one another by the interstitial glass bonding layers 311, 312, 313, et cetera. The thickness of the slice 300 is determined by the final cut as represented by the broken line 230 of FIG. 2. The dimensions of the individual elements 301, 302, 303, et cetera, are determined by the thickness of the initial slices selected as well as the thickness of the slices made from the bonded structure 100 of FIG. 1. It will be appreciated that a variation of these dimensions will result in individual elements of various rectilinear configurations. Although the elements have been shown as square on the slice 300 in FIG. 3, they may have a variety of rectilinear shapes as required in particular device configurations.

Moreover, as mentioned hereinbefore, although the slices in this particular embodiment are all of silicon semiconductor material, they may comprise other well-known semiconductor materials or may be combinations of such materials and may include interposed layers of insulating material such as quartz. It will, of course, be necessary to observe certain precautions relative to respective thermal coefficients of the materials joined in order to avoid stresses which may result in cracks and breaks in the bonded structures.

Figure 4:
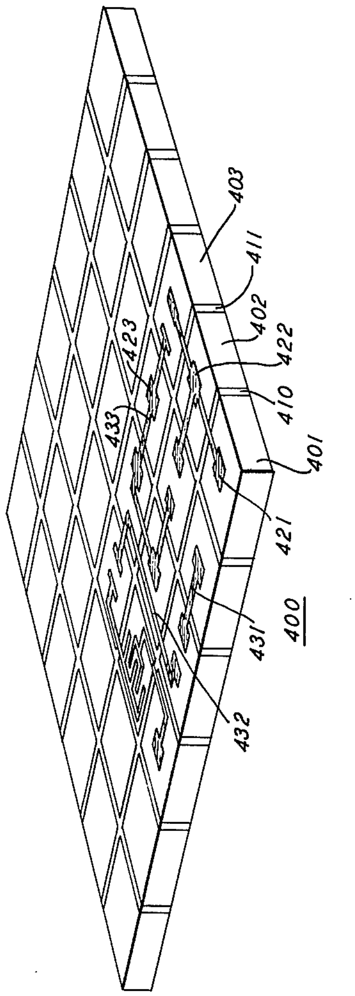
FIG. 4 is another view of the slice of bonded elements showing a deposited film circuit interconnecting some of the individual elements.

Referring to FIG. 4 of the drawing, a slice 400, produced in accordance with the method of this invention, is shown with deposited metal film electrodes as a schematic representation of one final form of an integrated circuit device. The enlarged areas 421, 422, 423, et cetera, represent metallic electrodes on devices such as diodes or transistors. The film portions 431, 432, 433, et cetera, represent deposited metal film interconnections between the metal electrodes. The methods of forming these structures are well known in the art. Generally, they involve initial deposition of the metal film electrodes in accordance with a pattern followed by a heat treatment to sinter this metal into the semiconductor regions to ensure good ohmic contact. The metal interconnections then are deposited through another mask to provide the desired pattern of interconnections. This particular advantageous arrangement of a deposited film circuit is enabled because of the relatively close spacing of the individual semiconductor elements and by the nature of the interstitial material.

Figure 5:
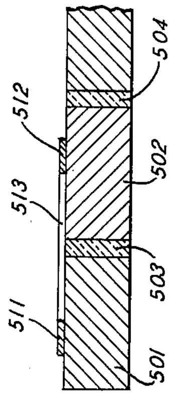
FIG. 5 is a section taken through a part of the slice showing the metal film electrodes and interconnections on the surface thereof.

Referring to the partial sectional view of FIG. 5, the semiconductor elements 501 and 502 are spaced apart by the vitreous bonding layer 503 which typically may have a thickness of about .001 to .002 inch. Thus the electrodes 511 and 512 on the surface of the elements 501 and 502, respectively, are conveniently connected by the deposited metal layer 513 bridging the glass layer 503. In connection with this explanation, certain intermediate fabrication steps have been omitted for the sake of clarity inasmuch as they do not form a part of this invention. Such steps may comprise the fabrication of an additional layer or layers on a surface of the slice 300 by epitaxial deposition techniques and the fabrication of conductivity type regions in the various individual semiconductor elements of the array by solid state diffusion methods employing well-known masking techniques, and in the thermal growth of silicon dioxide on the surface of the semiconductor wafers in order that the deposited metal interconnections may be electrically isolated from the semiconductor material beneath.

Moreover, although the particular embodiment illustrated and described herein results in a 6 x 6 slice having thirty-six individual elements, it will be obvious that arrays may be made with more or fewer elements provided, and provision may also be made for dividing the slice 300 of FIG. 3 into smaller arrays in subsequent fabication operations. For example, referring to FIG. 4, it may be desirable to cut the slice 400 in such a way as to form a separate array of the twelve individual elements on which the deposited film circuit is shown. Other portions of the slice may be divided into six-element units or other desirable numbers.

Although the invention has been described in terms of particular embodiments, it will be understood that other arrangements and configurations may be devised by those skilled in the art which will still fall within the scope and spirit of the invention.

What is claimed is:

1. A method of fabricating a unitary array of semiconductor elements in bonded, electrically insulated relation comprising forming an oxide film on the faces of a plurality of first slices of semiconductor material, vitreously bonding said plurality of slices together in layered form into a bonded structure, cutting said bonded structure into a series of second slices transverse to said first slices, forming an oxide layer on the faces of said second slices, vitreously bonding said second slices together to reform the bonded structure, and cutting said bonded structure into a series of third slices transverse to both said first and said second slices.

2. A method of fabricating a unitary array of individual semiconductor elements in bonded, electrically insulated relation comprising providing a plurality of first slices of semiconductor material, forming an oxide film on the faces of said slices, applying on at least one face of each slice a layer of glass, stacking said slices with at least one glass layer intervening each pair of adjacent slices, heating said assembly at a temperature below the melting point of the semiconductor for a period of time sufficient to fuse the glass and thereby bond said slices together, cutting said vitreously bonded structure into a series of second slices transverse to said first slices, repeating the steps followed in bonding said first slices together thereby to reform the bonded structure using said second slices, and cutting said bonded structure into a series of third slices transverse to both said first and said second slices.

3. A method in accordance with claim 2 in which said oxide film is silicon oxide.

4. A method in accordance with claim 2 in which said semiconductor material is silicon.

5. A method of fabricating a unitary array of individual silicon semiconductor elements in bonded, electrically insulated relation comprising providing a plurality of first slices of single crystal silicon semiconductor material, forming a silicon oxide film on the faces of said slices, applying on at least one face of each slice a layer of glass, stacking said slices with at least one glass layer intervening each pair of adjacent slices, heating said assembly at a temperature of between 1200 and 1300 degrees centigrade for a period of time sufficient to fuse the glass and thereby bond said slices together, cutting said vitreously bonded structure into a series of second slices transverse to said first slices, repeating the steps followed in bonding said first slices together thereby to reform the bonded structure using said second slices, and cutting said bonded structure into a series of third slices transverse to both said first and said second slices.

References Cited by the Examiner

UNITED STATES PATENTS

| | | | |
|---|---|---|---|
| 2,314,363 | 3/1943 | Moulton | 156—250 |
| 2,332,447 | 10/1943 | Higgins | 156—89 |
| 2,454,922 | 11/1948 | Hite | 156—89 |
| 2,865,082 | 12/1958 | Gates | 156—250 |
| 3,041,228 | 6/1962 | MacLeod | 156—67 |

FOREIGN PATENTS

| | | |
|---|---|---|
| 817,378 | 7/1959 | Great Britain. |

EARL M. BERGERT, *Primary Examiner.*

DOUGLASS J. DRUMMOND, *Examiner.*